United States Patent
Han et al.

(10) Patent No.: US 9,124,252 B2
(45) Date of Patent: *Sep. 1, 2015

(54) METHOD FOR REDUCING OUTPUT DATA NOISE OF SEMICONDUCTOR APPARATUS AND SEMICONDUCTOR APPARATUS IMPLEMENTING THE SAME

(71) Applicant: SK hynix Inc., Icheon-si Gyeonggi-do (KR)

(72) Inventors: Sung Woo Han, Icheon-si Gyeonggi-do (KR); Ic Su Oh, Icheon-si Gyeonggi-do (KR); Jun Ho Lee, Icheon-si Gyeonggi-do (KR); Boo Ho Jung, Icheon-si Gyeonggi-do (KR); Sun Ki Cho, Icheon-si Gyeonggi-do (KR); Yang Hee Kim, Icheon-si Gyeonggi-do (KR); Tae Hoon Kim, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/581,357

(22) Filed: Dec. 23, 2014

(65) Prior Publication Data

US 2015/0109041 A1   Apr. 23, 2015

Related U.S. Application Data

(63) Continuation of application No. 13/720,992, filed on Dec. 19, 2012, now Pat. No. 8,941,406.

(30) Foreign Application Priority Data

Aug. 30, 2012  (KR) .................. 10-2012-0095552

(51) Int. Cl.
| | |
|---|---|
| H04B 3/32 | (2006.01) |
| H04M 3/34 | (2006.01) |
| G06F 17/50 | (2006.01) |
| H03K 3/013 | (2006.01) |
| H03K 5/12 | (2006.01) |

(52) U.S. Cl.
CPC .............. H03K 3/013 (2013.01); H03K 5/12 (2013.01); *G06F 17/5022* (2013.01)

(58) Field of Classification Search
CPC ... G06F 17/5022; G06F 17/5036; H04B 3/32; H04M 3/34
See application file for complete search history.

(56) References Cited

U.S. PATENT DOCUMENTS

| | | | | |
|---|---|---|---|---|
| 7,961,001 | B1 * | 6/2011 | Ko ................... | 326/30 |
| 8,085,061 | B2 * | 12/2011 | Kinoshita et al. ........ | 326/30 |
| 8,476,923 | B2 * | 7/2013 | Jang et al. ............. | 326/30 |
| 8,618,843 | B2 * | 12/2013 | Liu et al. ............. | 327/108 |
| 8,710,861 | B2 * | 4/2014 | Kuroki et al. ......... | 326/30 |
| 8,941,406 | B2 * | 1/2015 | Han et al. ............. | 326/21 |
| 2013/0249591 | A1 * | 9/2013 | Harker et al. ......... | 326/21 |

* cited by examiner

*Primary Examiner* — Alexander H Taningco
*Assistant Examiner* — Kurtis R Bahr
(74) *Attorney, Agent, or Firm* — William Park & Associates Ltd.

(57) ABSTRACT

Provided is a semiconductor apparatus which includes a plurality of output buffers configured to connect a plurality of power sources, and a data noise measuring unit configured to fix an output data of a selected output buffer among the plurality of output buffers to have a specific level, measure a noise of the output data using a capacitance and control a slew rate of the plurality of output buffers based on the noise.

17 Claims, 8 Drawing Sheets

METHOD FOR REDUCING OUTPUT DATA NOISE OF SEMICONDUCTOR APPARATUS AND SEMICONDUCTOR APPARATUS IMPLEMENTING THE SAME

CROSS-REFERENCES TO RELATED APPLICATION

This application is a continuation of U.S. patent application Ser. No. 13/720,992 filed Dec. 19, 2012, the disclosure of which is incorporated herein by reference.

BACKGROUND

1. Technical Field

The present invention generally relates to a semiconductor design technology, and more particularly, to a method for reducing output data noise of a semiconductor apparatus and a semiconductor is apparatus implementing the same.

2. Related Art

In general, a semiconductor apparatus includes an output buffer to output data. The output buffer drives high data from a power supply voltage, and drives low data from a ground voltage.

FIG. 1 is a circuit diagram illustrating a data output unit of a conventional semiconductor apparatus including a plurality of output buffers. The data output unit of the semiconductor apparatus includes an output buffer section 10. The output buffer section 10 includes a plurality of output buffers BUF0 to BUFn configured to receive data D<0~n> and output the received data D<0~n> to input/output pads DQ<0~n>. At this time, on-die termination (ODT) circuits may be connected to the respective input/output pads DQ<0~n>, in order to compensate for impedance matching of the output data Q<0~n>.

The respective output buffers BUF0 to BUFn of the output buffer section 10 drive high data from a power supply voltage VDDQ, and drive low data from a ground voltage VSSQ. Since the respective output buffers BUF0 to BUFn receive power from the common power sources VDDQ and VSSQ, simultaneous switching noise may occur in a power supply voltage VDDQ or ground voltage VSSQ supplied to the output buffers BUF0 to BUFn when a plurality of data transit at the same time. For example, when a plurality of data transit to a high level to a low level, a large current IL1 may be passed to the ground voltage source VSSQ, and simultaneous switching noise VL1 may occur in the supplied ground voltage VSSQ due to parasitic inductance L1 of the ground voltage terminal. The principle that the simultaneous switching noise VL1 occurs may be expressed by Equation 1 below.

$$V_{L_1} = L_1 \frac{\partial I_{L_1}}{\partial t} \quad \text{[Equation 1]}$$

Furthermore, when a plurality of data transit from a low level to a high level, simultaneous switching noise VL2 may occur in the supplied power supply voltage VDDQ due to parasitic inductance L2 of the power supply voltage terminal, based on the above-described principle.

The simultaneous switching noise may cause noise in the output data Q<0~n>.

FIG. 2 is a graph illustrating data noise which may occur in the semiconductor apparatus of FIG. 1. FIG. 2 illustrates data noise which may occur when the plurality of output buffers drive output data Q<0:1> transiting from a high level to a low level. FIG. 2 also illustrates a power supply voltage VDDQ. Low-level output data Q<k> is driven to a specific output buffer, and output data Q<0~1> transiting from a high level (i.e., VOH) to a low level (i.e., VOL) are driven to a plurality of output buffers. Since the plurality of output buffers change data from a high level to a low level, large amounts of currents are passed to the ground voltage source VSSQ at the same time, and simultaneous switching noise VL1 occurs due to parasitic inductance. Due to the influence of the simultaneous switching noise VL1 occurring in the ground voltage VSSQ, data noise occurs in the output data Q<k> maintaining a low level.

Such output data noise does not guarantee the reliability of the entire semiconductor apparatus.

SUMMARY

In an embodiment, there is provided a method for reducing output data noise of a semiconductor apparatus which includes a plurality of output buffers to output data. The method includes the steps of: driving low data to a specific output buffer among the plurality of output buffers, and driving data transiting from a high level to a low level to the other output buffers; and measuring the magnitude of data noise occurring in output data of the specific output buffer, and deciding slew rates of the plurality of output buffers based on the measurement result.

In an embodiment, there is provided a method for reducing output data noise of a semiconductor apparatus which includes a plurality of output buffers to output data. The method includes the steps of: driving high data to a specific output buffer among the plurality of output buffers, and driving data transiting from a low level to a high level to the other output buffers; and measuring a magnitude of data noise occurring in output data of the specific output buffer, and deciding slew rates of the plurality of output buffers based on the measurement result.

In an embodiment, a semiconductor apparatus includes: a plurality of output buffers configured to be driven by a power supply voltage and a ground voltage and output received data; and a data noise measuring unit configured to measure the magnitude of data noise from output data of a specific output buffer among the plurality of output buffers, and generate a slew rate control signal to control slew rates of the plurality of output buffers based on the measurement result.

In an embodiment, a semiconductor apparatus includes: a plurality of output buffers configured to electrically connect a plurality of power sources, and a data noise measuring unit configured to fix an output data of a selected output buffer among the plurality of output buffers to have a specific level, measure a noise of the output data using a capacitance and control a slew rate of the plurality of output buffers based on the noise.

BRIEF DESCRIPTION OF THE DRAWINGS

Features, aspects, and embodiments are described in conjunction with the attached drawings, in which.

DETAILED DESCRIPTION

Hereinafter, a method for reducing output data noise of a semiconductor apparatus and a semiconductor apparatus implementing the same according to the embodiments will be to described below with reference to the accompanying drawings through various embodiments.

Figure 1:
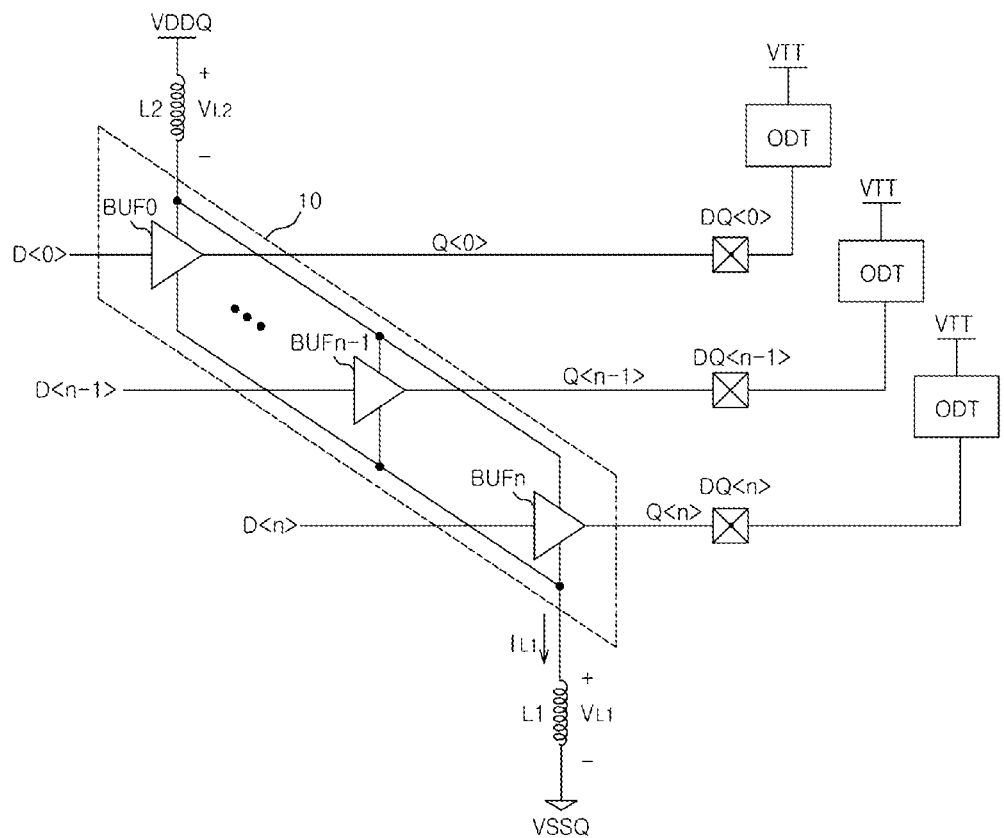
FIG. 1 is a circuit diagram illustrating a data output unit of a conventional semiconductor apparatus including a plurality of output buffers.
Figure 2:
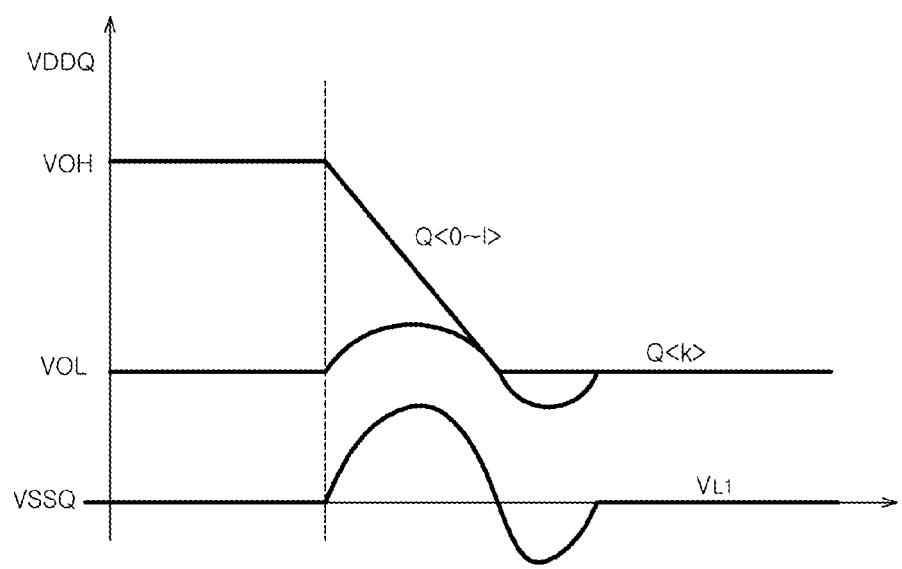
FIG. 2 is a graph illustrating data noise which may occur in the semiconductor apparatus of FIG. 1.
Figure 3:
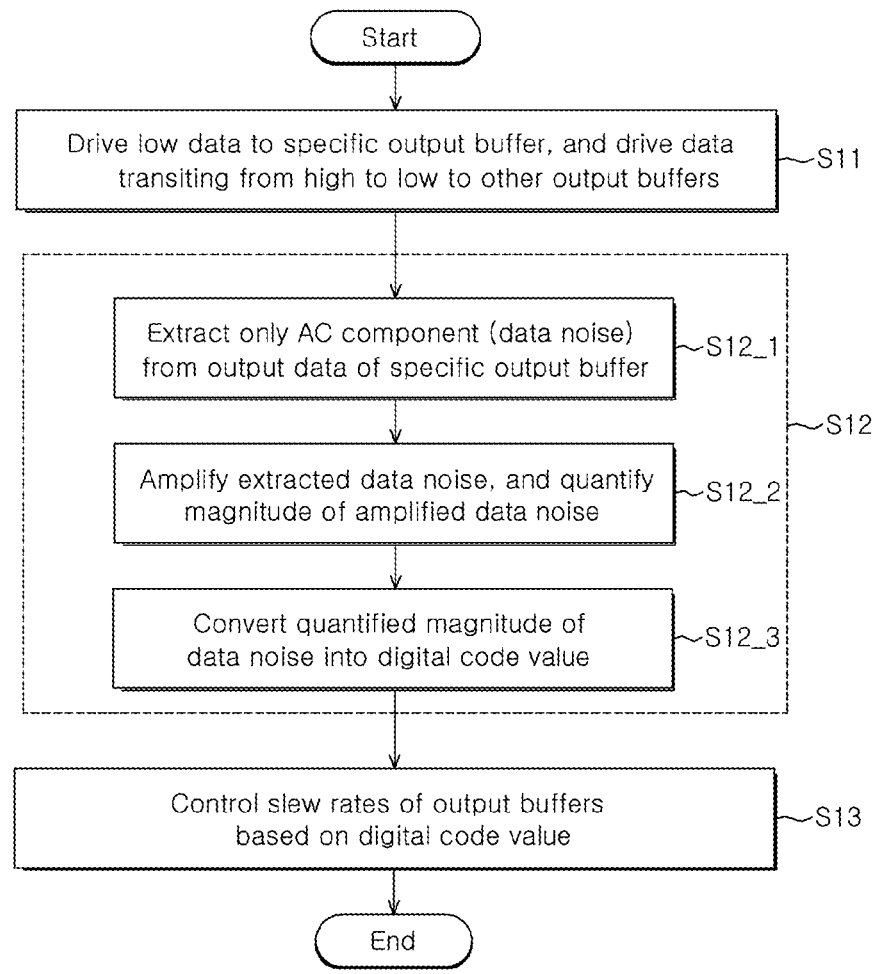
FIG. 3 is a flow chart showing a method for reducing output data noise of a semiconductor apparatus according to an embodiment.

FIG. 3 is a flow chart showing a method for reducing output data noise of a semiconductor apparatus according to an embodiment.

The method for reducing output data noise, shown in FIG. 3, may widely be applied to not only a data output unit of a semiconductor apparatus which outputs data to the outside, but also any parts of a semiconductor apparatus using output buffers.

In an embodiment, the method for removing output data noise may be used to initially set output buffers during the initial setting of a semiconductor apparatus.

The method for removing output data noise of a semiconductor apparatus according to an embodiment measures the maximum data noise occurring in output buffers, and controls a slew rate of the output buffers based on the magnitude of the data noise. As data noise increases, the influence of simultaneous switching noise caused by parasitic inductance may increase. In this case, the amounts of currents flowing in a power supply terminal at the same time during switching are reduced by decreasing the slew rate.

Specifically, the maximum data noise occurring in output buffers is measured to remove output data noise of the semiconductor apparatus according to an embodiment. That is, low data is continuously driven to only a specific output buffer of a plurality of output buffers, and data transiting from a high level to a low level are driven to other output buffers at step S11. In order to to measure the maximum data noise, low data may be driven to only a specific output buffer. In this case, due to the influence of the plurality of output buffers to change data to a high level to a low level, simultaneous switching noise occurs in the power supply terminal. Due to the simultaneous switching noise, data noise occurs in low data outputted from the specific output buffer.

Then, the magnitude of the data noise occurring in the output data of the specific output buffer is measured, and the slew rates of the plurality of output buffers are decided based on the measurement result. Specifically, this process includes a step S12 of measuring the magnitude of the data noise occurring in the output data of the specific output buffer and converting the measured magnitude into a digital code value and a step S13 of controlling the slew rates of the plurality of output buffers based on the digital code value. During the step S13 of controlling the slew rates of the plurality of output buffers based on the digital code value, the slew rates of the entire output buffers may be controller together, which is desirable in terms of design efficiency.

Specifically, the step S12 of measuring the magnitude of the data noise occurring in the output data of the specific output buffer and converting the measured magnitude into a digital code value is performed as follows.

First, the data noise is amplified, and the magnitude of the amplified data noise is quantified by rectifying the amplified data noise at step S12_2. That is, the magnitude of the amplified data noise is indicated by a specific analog voltage level.

Then, the quantified magnitude of the amplified data noise is converted into the corresponding digital code value at step S12_3. For example, when the voltage level of the quantified data noise is higher than a specific reference level, the digital code value may be set to reduce the slew rate of the output buffer. On the other hand, when the voltage level of the quantified data noise is lower than the specific reference level, the digital code value may be set to increase the slew rate of the output buffer.

At this time, considering a case in which the low-level output data of the specific output buffer is influenced by an ODT circuit or the like so as to contain a DC component, the method may further include a step S12_1 of removing a DC component of the output data and extracting an AC component as the data noise.

In the step S13 of controlling the slew rates of the plurality of output buffers based on the digital code value, when the magnitude of the data noise is larger than a reference value, the slew rates of the plurality of output buffers are reduced in response to the digital code value. When the slew rates of the output buffers are reduced, it means that the output buffers reduce the amounts of currents driven at the same time. Therefore, the influence of simultaneous switching noise may be reduced, and thus data noise may be reduced.

On the other hand, when the magnitude of the data noise is smaller than the reference value, the slew rates of the plurality of to output buffers may be increased in response to the corresponding digital code value. This means that simultaneous switching noise does not have an effect on the data output result. Therefore, the slew rates of the output buffers may be increased to a proper value for an efficient operation of the output buffers.

Figure 4:
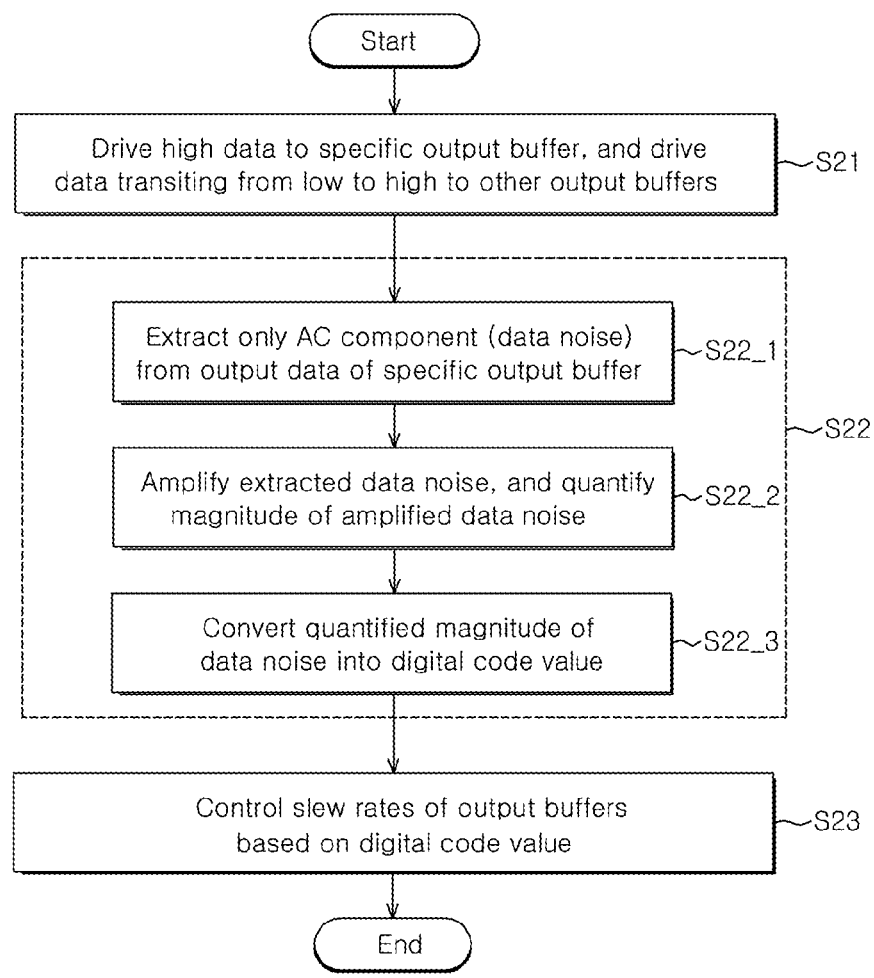
FIG. 4 is a flow chart showing a method for reducing output data noise of a semiconductor apparatus according to an embodiment.

FIG. 4 is a flow chart showing a method for reducing output data noise of a semiconductor apparatus according to an embodiment.

The method for reducing output data noise, shown in FIG. 4, may be applied to not only a data output unit of a semiconductor apparatus which outputs data to the outside, but also any parts of the semiconductor apparatus using output buffers.

The method for reducing output data noise according to an embodiment may be used to initially set output buffers during the initial setting of a semiconductor apparatus.

The method for reducing output data noise of a semiconductor apparatus according to an embodiment measures the maximum data noise occurring in the output buffers, and adjusts the slew rates of the output buffers based on the magnitude of the data noise. As the data noise increases, the influence of simultaneous switching noise caused by parasitic inductance may increase. In this case, the slew rates are reduced to decrease the amounts of currents flowing into the power supply terminal at the same time during switching.

Specifically, in order to reduce output data noise of the semiconductor apparatus according to an embodiment, the maximum data noise occurring in the output buffers is first measured. The method of FIG. 4 is different from the method of FIG. 3 in that high data is continuously driven to only a specific output buffer of the plurality of output buffers, and data transiting from a low level to a high level are driven to the other output buffers at step S21. That is, the method of FIG. 3 considers the maximum simultaneous switching noise occurring in the ground voltage terminal, and the method of FIG. 4 considers the maximum simultaneous switching noise occurring in the power supply voltage terminal. In order to measure the maximum data noise, high data may be driven to only a specific output buffer. In this case, simultaneous switching noise occurs in the power supply voltage terminal due to the influence of the plurality of output buffers changing data from a low level to a high level. Due to the simultaneous switching noise, data noise occurs in high data outputted from the specific output buffer.

Subsequent steps are performed in a similar manner to the above-described embodiment of FIG. 3. That is, the magnitude of the data noise occurring in the output data of the specific output buffer is measured, and the slew rates of the plurality of output buffers are decided based on the measurement result. Specifically, the method includes a step S22 of measuring the magnitude of the data noise occurring in the output data of the specific output buffer and converting the measured magnitude into a digital code value and a step S23 of controlling the slew rates of the plurality of output buffers based on the digital code value. During the step S23 of controlling the slew rates of the plurality of output buffers based on the digital code value, the slew rates of the entire output buffers may be adjusted together, which is desirable in terms of design efficiency.

Specifically, the step S22 of measuring the magnitude of the data noise occurring in the output data of the specific output buffer and converting the measured magnitude into a digital code value is performed as follows.

First, a DC component is removed from the high-level output data of the specific output buffer, and an AC component is extracted as the data noise at step S22_1. This is in order to acquire only the noise excluding the data.

Then, the data noise is amplified, and the magnitude of the amplified data noise is quantified by rectifying the amplified data noise at step S22_2. That is, the magnitude of the amplified data noise is indicated by a specific analog voltage level.

Then, the quantified magnitude of the amplified data noise is converted into the corresponding digital code value at step S22_3. For example, when the voltage level of the quantified data noise is higher than a specific reference level, the digital code value may be set to reduce the slew rate of the output buffer. On the other hand, when the voltage level of the quantified data noise is lower than the specific reference level, the digital code value may be set to increase the slew rate of the output buffer.

In the step S23 of controlling the slew rates of the plurality of output buffers based on the digital code value, when the magnitude of the data noise is larger than a reference value, the slew rates of the plurality of output buffers are reduced in response to the digital code value. When the slew rates of the output buffers are reduced, it means that the output buffers reduce the amounts of currents driven at the same time. Therefore, the influence of simultaneous switching noise may be reduced, which makes it possible to reduce data noise.

On the other hand, when the magnitude of the data noise is smaller than the reference value, the slew rate of the plurality of output buffers may be increased in response to a corresponding digital code value. This means that simultaneous switching noise does not have an effect on the data output result. Therefore, the slew rates of the output buffers may be increased to a proper value for the efficient operation of the output buffers.

Figure 5:
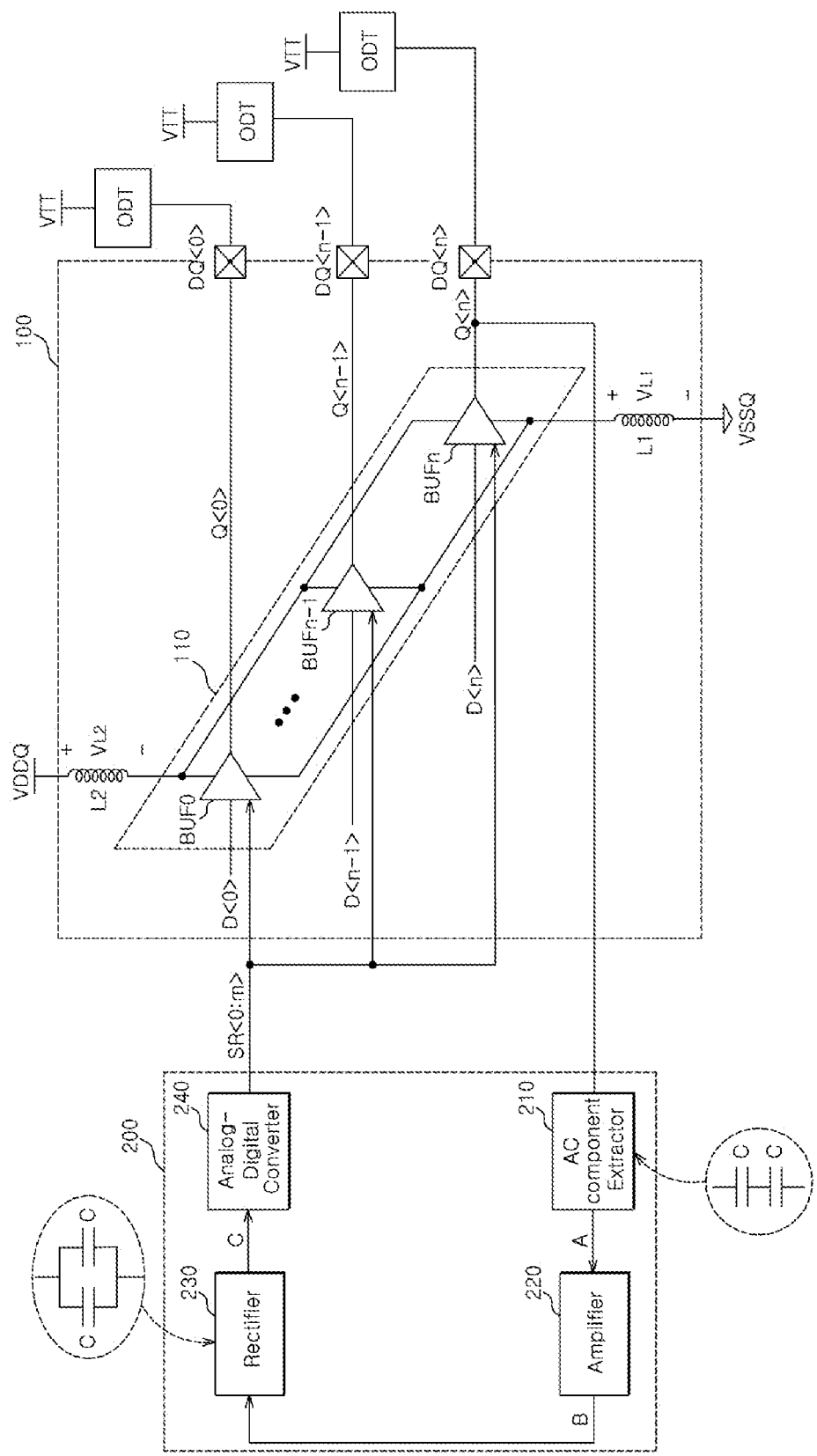
FIG. 5 is a diagram illustrating the configuration of a semiconductor apparatus implementing the method for reducing output data noise according to an embodiment.

FIG. 5 is a diagram illustrating the configuration of a semiconductor apparatus implementing the method for reducing output data noise according to an embodiment.

FIG. 5 illustrates output buffers of a data output unit to output data to the outside. However, this technology may be widely applied to any parts of a semiconductor apparatus using output buffers.

The semiconductor apparatus illustrated in FIG. 5 may include a data output unit 100 and a data noise measuring unit 200.

The data output unit 100 may include an output buffer section 110. The output buffer section 110 may include a plurality of output buffers BUF0 to BUFn configured to receive data D<0~n> and output the received data to input/output pads DQ<0~n>. At this time, in order to compensate for impedance mismatching of output data Q<0~n>, ODT circuits may be connected to the respective input/output pads DQ<0~n>.

The respective buffers BUF0 to BUFn of the output buffer section 110 drive high data from a power supply voltage VDDQ, and drive low data from a ground voltage VSSQ. Since the output buffers BUF0 to BUFn receive voltages from the common power sources VDDQ and VSSQ, simultaneous switching noises VL1 and VL2 may occur in the ground voltage VSSQ and the power supply voltage VDDQ due to parasitic capacitances L1 and L2, respectively, when a plurality of data transit at the same time. The simultaneous switching noises VL1 and VL2 cause noise in the output data Q<0~n>.

The semiconductor apparatus according to an embodiment measures the magnitude of noise of the output data Q<0~n> based on the simultaneous switching noises VL1 and VL2 which may occur to the maximum, and controls the slew rates of the output buffers BUF0 to BUFn based on the measured magnitude of the noise. For example, in order to generate data noise based on the simultaneous switching noise VL1 of the ground voltage terminal, low data is driven to a specific output buffer BUFn and data transiting from a high level to a low level are driven to the other output buffers BUF0 to BUFn−1, during the initial setting. Additionally, in order to measure the maximum data noise, low data may be driven to only the specific output buffer BUFn.

On the other hand, in order to generate data noise based on the simultaneous switching noise VL2 of the power supply voltage terminal, high data is driven to the specific output buffer BUFn and data transiting from a low level to a high level are driven to the other output buffers BUF0 to BUFn−1, during the initial setting. Additionally, in order to measure the maximum data noise, high data may be driven to only the specific output buffer BUFn.

The data noise measuring unit 200 may be configured to measure the magnitude of data noise from the output data Q<n> of the specific output buffer BUFn, and generate a slew rate control signal SR<0:m> to control the slew rates of the plurality of output buffers BUF0 to BUFn based on the measurement result. Additionally, it is desirable to control the slew rates of the entire output buffers BUF0 to BUFn together, in terms of design efficiency.

Specifically, the data noise measuring unit 200 may include an AC component extractor 210, an amplifier 220, a rectifier 230, and an analog-digital converter 240.

The AC component extractor 210 may be configured to remove a DC component from the output data Q<n> of the specific output buffer BUFn and output an AC component as the data noise. This is in order to acquire only the noise excluding data from the output data Q<n>. Specifically, the AC component extractor 210 may include capacitors connected in series.

The amplifier 220 may be configured to amplify the to extracted data noise such that the magnitude of the extracted data noise can be recognized. Specifically, the amplifier 220 may include operational amplifier (op-amp).

The rectifier 230 may be configured to rectify the amplified data noise and quantify the magnitude of the amplified data noise. That is, the rectifier 230 quantifies the magnitude of the data noise to a specific voltage level such that the magnitude of the data noise can be compared. Specifically, the rectifier 230 may include rectification capacitor filters connected in parallel to the capacitors.

The analog-digital converter 240 may be configured to convert the quantified magnitude of the amplified data noise to a corresponding digital code value and output the digital code value as the slew rate control signal SR<0:m>. Additionally, the analog-digital converter 240 may include a register (not illustrated) to store a reference value, and converts the quantified voltage level of the amplified data noise into the slew rate control signal SR<0:m> based on the reference value. For example, the slew rate control signal SR<0:m> may be set to drop as the quantified voltage level of the amplified data noise is larger than the reference value, and may be set to rise as the quantified voltage level of the amplified data noise is smaller than the reference value. Since the analog-digital converter 240 is generally used in a semiconductor apparatus, the detailed descriptions thereof are omitted herein.

The plurality of output buffers BUF0 to BUFn of the output buffer unit 110 receive the slew control signal SR<0:m> to control the slew rates. For example, when the voltage level of the amplified data noise is larger than the reference value, the slew rates may be reduced in response to the received slew rate control signal SR<0:m>. When the slew rates of the output buffers BUF0 to BUFn are reduced, it means that the output buffers BuF0 to BUFn reduce the amounts of currents driven at the same time. Therefore, the influence of simultaneous switching noise may be reduced, and thus data noise may be reduced.

Additionally, when the voltage level of the amplified data noise is smaller than the reference value, the slew rates may be increased in response the received slew control signal SR<0:m>. This means that the simultaneous switching noise does not have an effect on the data output result. Therefore, the slew rates of the output buffers may be increased to a proper reference value for an efficient operation of the output buffers BUF0 to BUFn.

Figure 6:
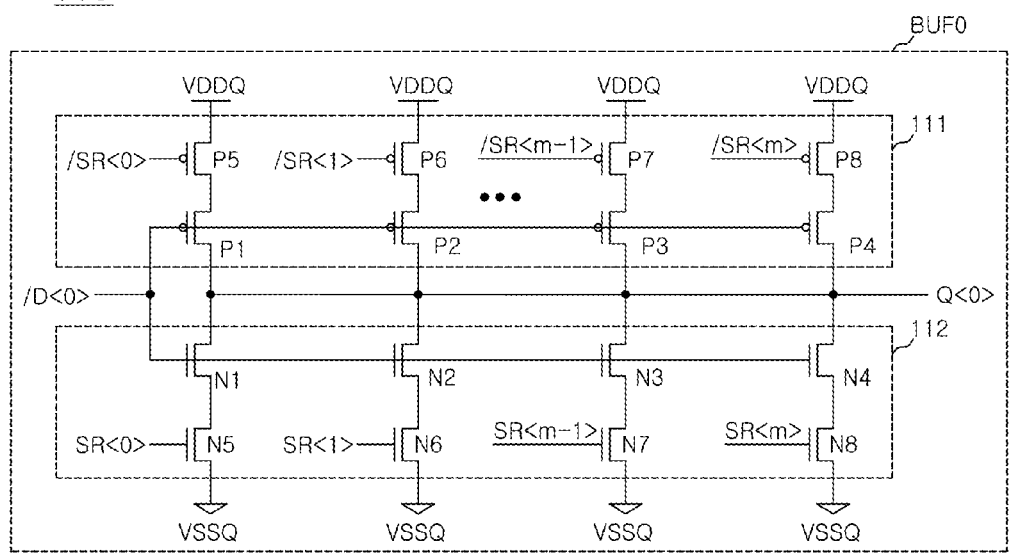
FIG. 6 is a circuit diagram illustrating an embodiment of an output buffer of FIG. 5.

FIG. 6 is a circuit diagram illustrating an embodiment of the output buffer BUF0 of the output buffer section 110.

The output buffer BUF0 according to an embodiment receives inverted data/D<0> and transmits output data Q<0>. Specifically, the output buffer BUF0 may include a pull-up driver 111 and a pull-down driver 112.

The pull-up driver 111 may be configured to drive high data from the power supply voltage VDDQ according to the level of the inverted data/D<0>, and control the slew rate in response to the inverted slew rate control signal/SR<0:m>.

The pull-down driver 112 may be configured to drive low data from the ground voltage VSSQ according to the level of the inverted data/D<0>, and control the slew rate in response to the slew rate control signal SR<0:m>.

The pull-up driver 111 may include a plurality of pull-up transistors P1 to P4 and a plurality of PMOS switch transistors P5 to P8. The plurality of pull-up transistors P1 to P4 serve to receive the inverted data/D<0> and output the output data Q<0>. The plurality of PMOS switch transistors P5 to P8 receives the inverted slew rate control signal/SR<0:m> and are then selectively enabled in response to the respective bits of the inverted slew rate control signal/SR<0:m>.

The pull-down driver 112 may include a plurality of pull-down transistors N1 to N4 and a plurality of NMOS switch transistors N5 to N8. The plurality of pull-down transistors N1 to N4 serve to receive the inverted data/D<0> and output the output data Q<0>. The respective NMOS switch transistors N5 to N8 receives the slew rate control signal SR<0:m> and are then selectively enable in response to the respective bits of the slew rate control signal SR<0:m>.

That is, as the number of PMOS and NMOS switch transistors enabled according to the slew rate control signal SR<0:m> increases, the slew rate increases. Furthermore, as the number of PMOS and NMOS switch transistors enabled according to the slew rate control signal SR<0:m> decreases, the slew rate to decreases.

Figure 7A:
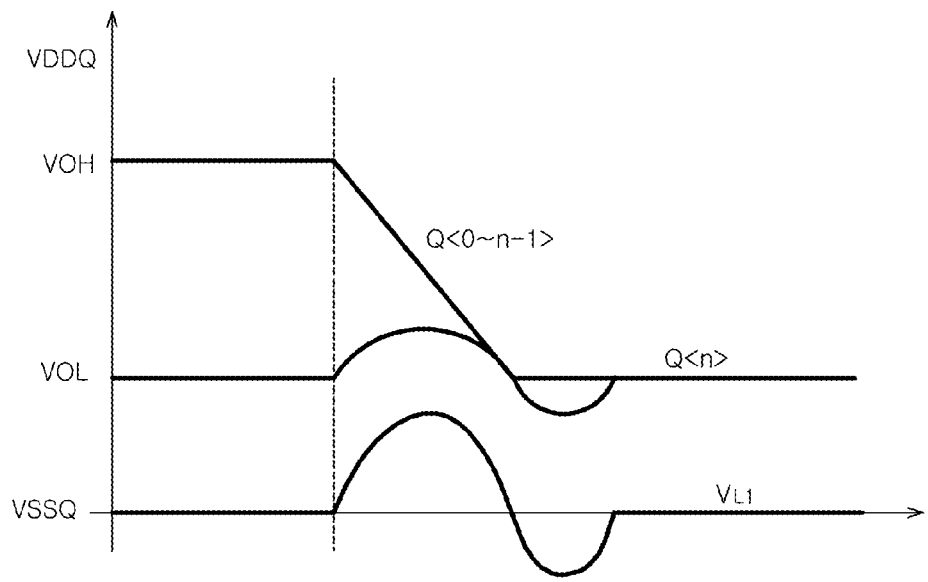
FIGS. 7A and 7B are graphs illustrating an example of the operation of the semiconductor apparatus of FIG. 5.
Figure 7B:
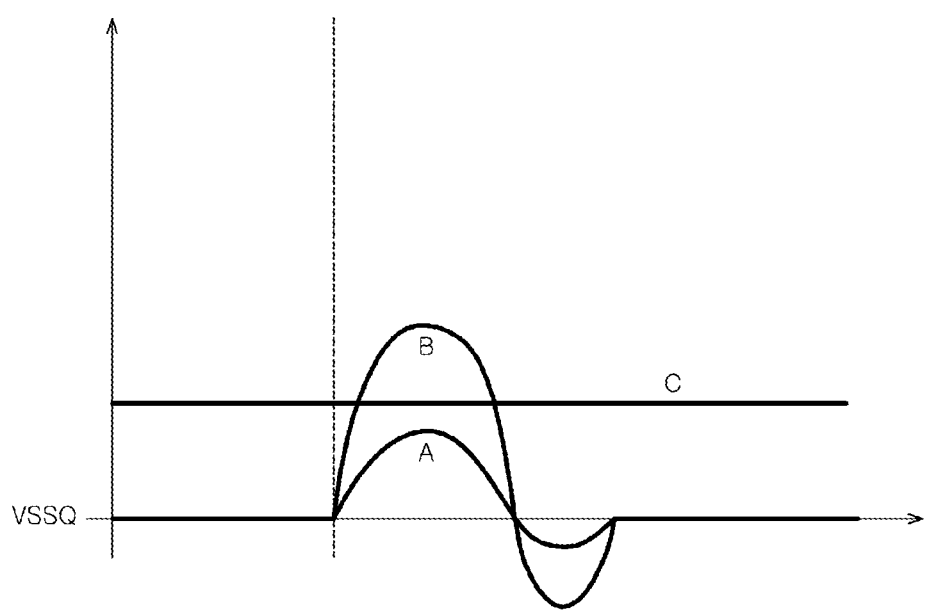

FIGS. 7A and 7B are graphs illustrating an example of the operation of the semiconductor apparatus. FIGS. 7A and 7B illustrate the operation of generating the maximum simultaneous switching noise VL1 in the ground terminal and measuring data noise.

FIG. 7A illustrates the operation of the output buffer section 110 of the data output unit 100.

Referring to FIG. 7A, during initial setting, low data Q<n> is driven to a specific output buffer, and data Q<0~n-1> transiting from a high level (i.e., VOH) to a low level (i.e., VOL) are driven to the other output buffers in order to generate the maximum data noise in the low data Q<n>. Due to the influence of the transiting data Q<0~n-1>, simultaneous switching noise VL1 occurs in the ground voltage terminal, thereby causing data noise in the low data Q<n>. FIG. 7A also illustrates power supply voltage VDDQ and ground voltage VSSQ.

FIG. 7B illustrates the operation of the data noise measuring unit 200 to receive the low data.

The AC component extractor 210A removes a data component of the low data Q<n>, and extracts only a noise component as data noise A (see also FIG. 5). The amplifier 220 amplifies the data noise A and outputs the amplified data noise B (see also FIG. 5). The rectifier 230 rectifies the amplified data noise B, and outputs the magnitude of the amplified data noise as a specific voltage level C (see also FIG. 5).

Then, the analog-digital converter 240 converts the voltage level C into a corresponding digital code value and outputs the corresponding digital code value as the slew rate control signal SR<0:m>, and the output buffer section 110 controls a slew rate in response to the slew rate control signal SR<0:m>. FIG. 7B also illustrates ground voltage VSSQ.

Figure 8A:
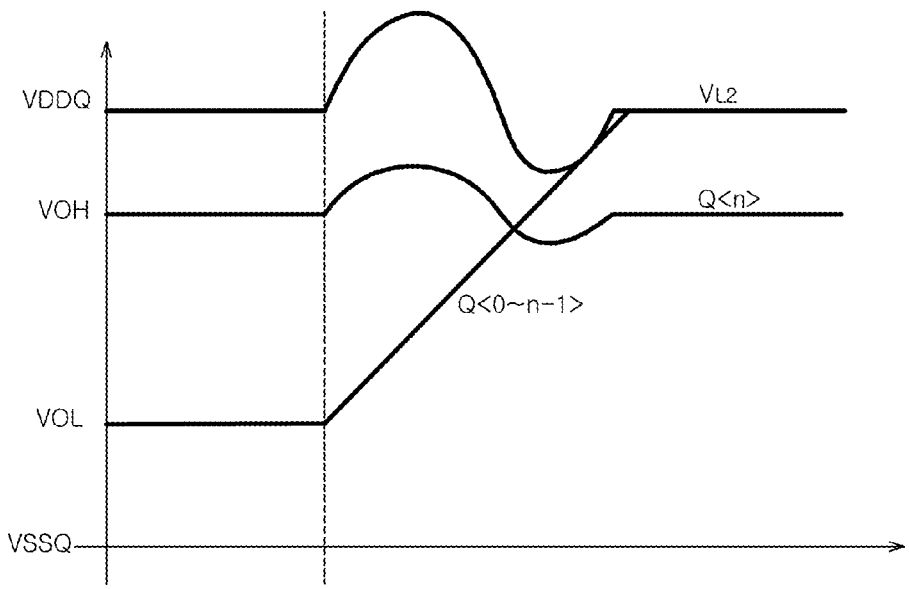
FIGS. 8A and 8B are graphs illustrating another example of the operation of the semiconductor apparatus of FIG. 5.
Figure 8B:
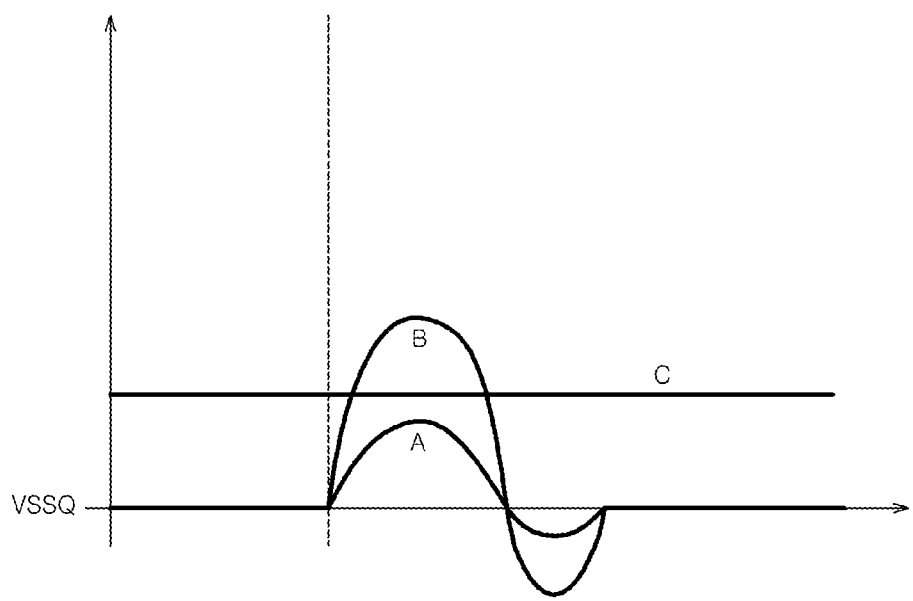

FIGS. 8A and 8B are graphs illustrating another example of the operation of the semiconductor apparatus. FIGS. 8A and 8B illustrate the operation of generating the maximum simultaneous switching noise VL2 in the power supply voltage terminal and measuring data noise.

FIG. 8A illustrates the operation of the output buffer section 110 of the data output unit 100.

Referring to FIG. 8A, during initial setting, high data Q<n> is driven to a specific output buffer, and data Q<0~n-1> transiting from a low level (i.e., VOL) to a high level (i.e., VOH) are driven to the other output buffers in order to generate the maximum data noise in the high data Q<n>. Due to the influence of the transiting data Q<0~n-1>, the simultaneous switching noise VL2 occurs in the power supply voltage terminal, thereby causing data noise in the high data Q<n>. FIG. 8A also illustrates power supply voltage VDDQ and ground voltage VSSQ.

FIG. 8B illustrates the operation of the data noise measuring unit 200 to receive the high data.

The AC component extractor 210A removes a data to component of the high data Q<n>, and extracts only a noise component as data noise A (see also FIG. 5). The amplifier 220 amplifies the data noise A, and outputs the amplified data noise B (see also FIG. 5). The rectifier 230 rectifies the amplified data noise B, and outputs the magnitude of the amplified data noise B as a specific voltage level C (see also FIG. 5).

Then, the analog digital converter 240 converts the voltage level C into a corresponding digital code value and outputs the corresponding digital code value as the slew rate control signal SR<0:m>, and the output buffer section 110 controls a slew rate in response to the slew rate control signal SR<0:m>. FIG. 8B also illustrates ground voltage VSSQ.

While various embodiments have been described above, it will be understood to those skilled in the art that the embodiments described are by way of example only. Accordingly, the semiconductor apparatus described herein should not be limited based on the described embodiments.

What is claimed is:

1. A semiconductor apparatus comprising:
a plurality of output buffers configured to electrically connect a plurality of power sources; and
a data noise measuring unit configured to set an output data of a selected output buffer among the plurality of output buffers to have a first level, measure a noise of the output data of the selected output buffer using a capacitance and control a slew rate of the plurality of output buffers based on the noise.

2. The semiconductor apparatus according to claim 1, wherein the data noise measuring unit is configured to generate a slew rate control signal to control the slew rate.

3. The semiconductor apparatus according to claim 2, wherein when the magnitude of the noise is larger than a reference value, the slew rates of the plurality of output buffers are decreased in response to the slew rate control signal.

4. The semiconductor apparatus according to claim 2, wherein when the magnitude of the noise is smaller than a reference value, the slew rates of the plurality of output buffers are increased in response to the slew rate control signal.

5. The semiconductor apparatus according to claim 1, wherein during initial setting, low data is driven to the selected output buffer, and data transiting from a high level to a low level are driven to the other output buffers.

6. The semiconductor apparatus according to claim 1, wherein during initial setting, high data is driven to the selected output buffer, and data transiting from a low level to a high level are driven to the other output buffers.

7. The semiconductor apparatus according to claim 1, wherein the data noise measuring unit includes at least one capacitor for extracting the noise.

8. The semiconductor apparatus according to claim 1, wherein the data noise measuring unit comprises:
an AC component extractor configured to remove a DC component from the output data of the selected output buffer and extracts an AC component as the noise;
an amplifier configured to amplify the magnitude of the extracted noise;
a rectifier configured to rectify the amplified noise and quantify the magnitude of the amplified noise; and
an analog-digital converter configured to convert the quantified magnitude of the amplified noise into the corresponding digital code value and output the slew rate control signal.

9. The semiconductor apparatus according to claim 8, wherein the AC component extractor comprises capacitors connected in series.

10. The semiconductor apparatus according to claim 8, wherein the rectifier comprises a capacitor filter including capacitors connected in parallel.

11. The semiconductor apparatus according to claim 8, wherein the analog-digital converter comprises a register to store a reference value, and convert the quantified magnitude of the amplified data noise into the digital code value based on the reference value.

12. The semiconductor apparatus according to claim 1, further comprising a plurality of input/output pads electrically connected to the plurality of output buffers, respectively.

13. The semiconductor apparatus according to claim 12, further comprising a plurality of ODT circuits electrically connected to the plurality of input/output pads,
wherein the plurality of ODT circuits is configured to compensate for impedance mismatching of the output data.

14. The semiconductor apparatus according to claim 1, wherein the plurality of power sources include a power supply voltage and a ground voltage.

15. The semiconductor apparatus according to claim 1, wherein the plurality of output buffers is configured to drive high data from a power supply voltage.

16. The semiconductor apparatus according to claim 1, wherein the plurality of output buffer is configured to drive low data from a ground voltage.

17. The semiconductor apparatus according to claim 1, wherein the data noise measuring unit is configured to transit output data of the other output buffers from a second level to the first level, respectively, before the measuring the noise.

* * * * *